United States Patent [19]

Kephart

[11] Patent Number: 4,950,913

[45] Date of Patent: Aug. 21, 1990

[54] PROGRAMMABLE TIMER POWER SWITCH UNIT

[76] Inventor: David A. Kephart, 813 Logan Blvd., Hollidaysburg, Pa. 16648

[21] Appl. No.: 341,224

[22] Filed: Apr. 21, 1989

[51] Int. Cl.$^5$ .............................. B60L 1/00; H02H 7/00
[52] U.S. Cl. .................................... 307/10.7; 307/10.1; 307/592; 307/116; 340/438; 340/683; 340/636; 340/825.22
[58] Field of Search ...................... 307/9.1, 10.1–10.3, 307/10.7, 39, 360, 592, 593, 597, 598, 112, 116, 117, 125, 126, 130, 131, 141; 320/29–34, 38, 40, 45, 47, 48, 54, 5–14; 361/90, 92, 93, 170, 187, 195–197, 205; 340/428–430, 438, 455, 459, 527–529, 636, 662, 663, 825.16, 825.22, 522, 566, 683, 439, 441; 364/138, 141, 143, 492, 424.01, 424.03, 424.05, 431.08, 431.09

[56] References Cited

U.S. PATENT DOCUMENTS

| | | | |
|---|---|---|---|
| 2,534,276 | 12/1950 | Lancor, Jr. ............................. | 73/35 |
| 2,870,753 | 1/1959 | Shuch et al. ........................ | 340/439 X |
| 2,999,980 | 9/1961 | Barnes . | |
| 3,641,550 | 2/1972 | Lynas et al. ......................... | 73/116 X |
| 3,997,888 | 12/1976 | Kremer ................................ | 320/48 X |
| 4,071,822 | 1/1978 | Kamiya ................................ | 324/111 |
| 4,281,290 | 7/1981 | Peacey et al. ...................... | 324/426 |
| 4,290,109 | 9/1981 | Taniguchi et al. .................. | 364/481 |
| 4,415,979 | 11/1983 | Hernandez ......................... | 364/508 |
| 4,581,571 | 4/1986 | Hansen ............................... | 320/13 |
| 4,595,872 | 6/1986 | Ball ..................................... | 320/13 |
| 4,665,370 | 5/1987 | Holland ............................... | 324/429 |
| 4,683,414 | 7/1987 | Moore ................................. | 320/13 |
| 4,719,427 | 1/1988 | Morishita et al. .................. | 324/427 |
| 4,733,100 | 3/1988 | Nusairat et al. ................... | 307/9.1 |
| 4,754,159 | 6/1988 | Pointout et al. ................... | 307/9.1 |
| 4,758,772 | 7/1988 | Lang ................................... | 320/48 |
| 4,779,050 | 10/1988 | Ohnari ................................ | 324/426 |
| 4,820,966 | 4/1989 | Fridman ............................. | 320/32 |
| 4,864,154 | 9/1989 | Copeland et al. ................. | 307/10.7 |

OTHER PUBLICATIONS

AAA Communication Manufacturers, DG 100 Series Mobile Radio Delay Off Timer, (4 pages).

Primary Examiner—A. D. Pellinen
Assistant Examiner—David Osborn
Attorney, Agent, or Firm—Dennison, Meserole Pollack & Scheiner

[57] ABSTRACT

A programmable timer power switch unit for use with a battery includes a power switch receives power from the battery and switches the power to equipment. The unit also has a charge-discharge detector connected to the battery to detect a potential charge of the battery and a vibration-pressure detector which detects any movement of or sounds from the motor. There is a timer-control logic which is connected to the components and disables the power switch when any problems are detected. The unit further includes a programmable delay switch. The purpose of this switch is to allow the equipment to run during a pre-selected item. Also, there is a manual override switch for overriding the timer-control logic when necessary.

20 Claims, 5 Drawing Sheets

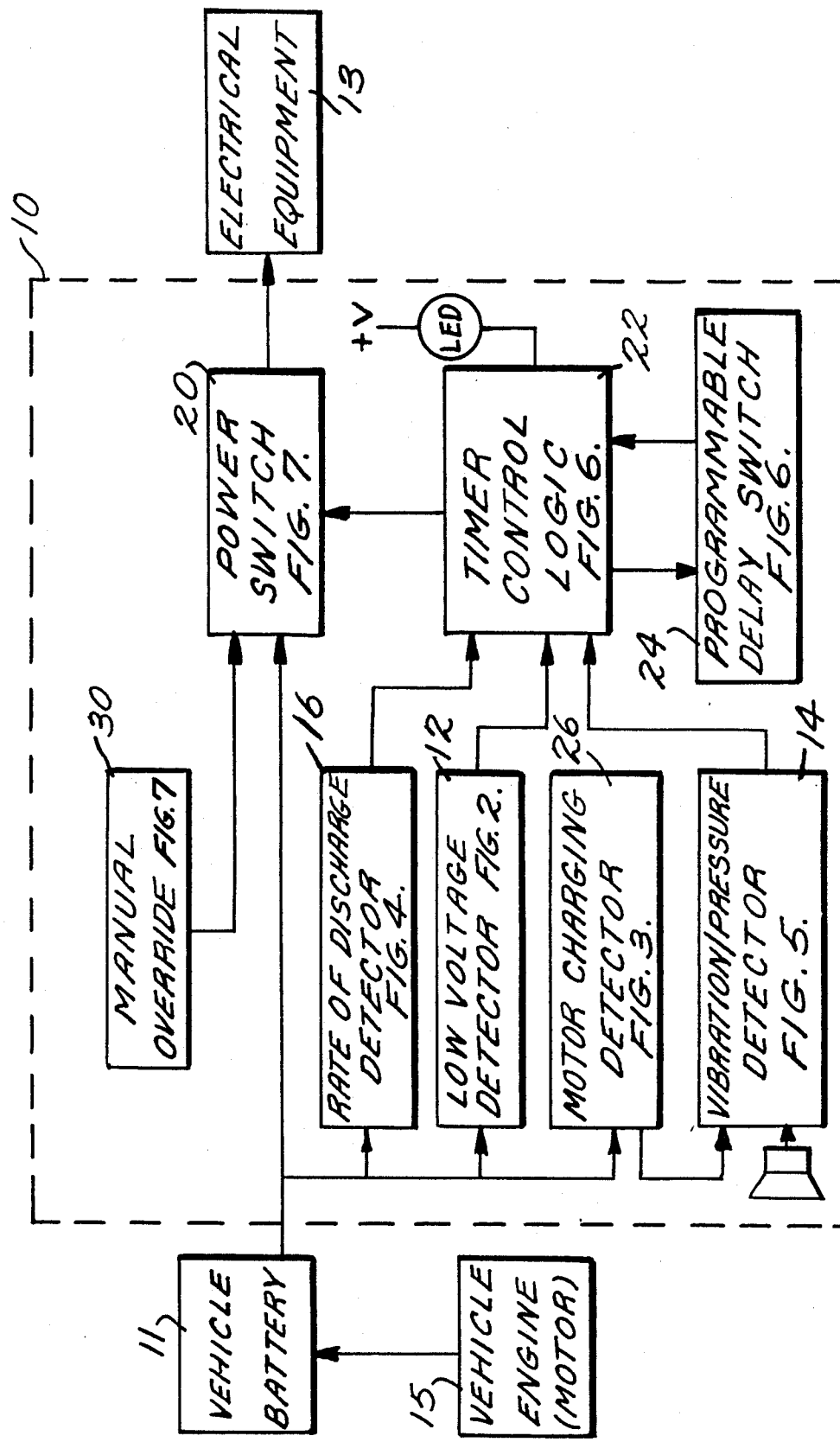

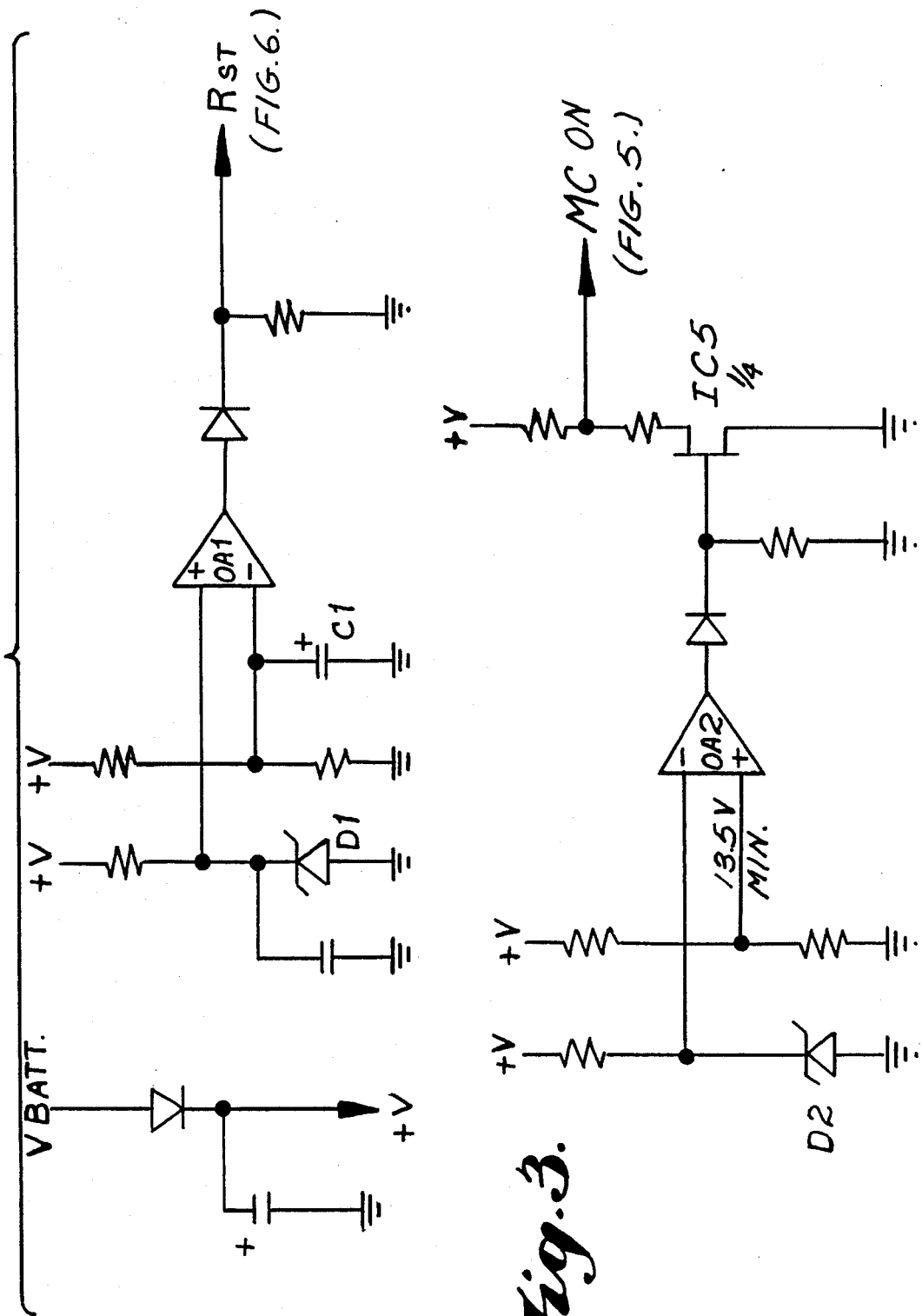

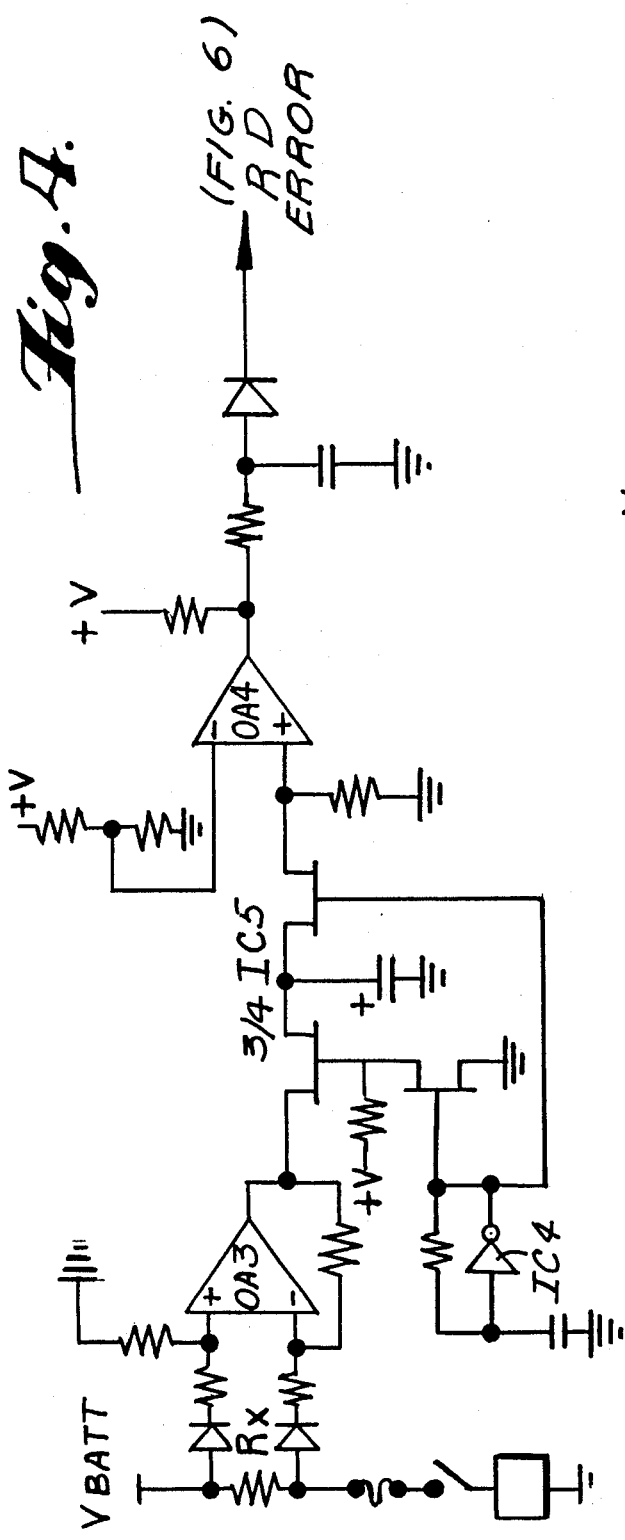
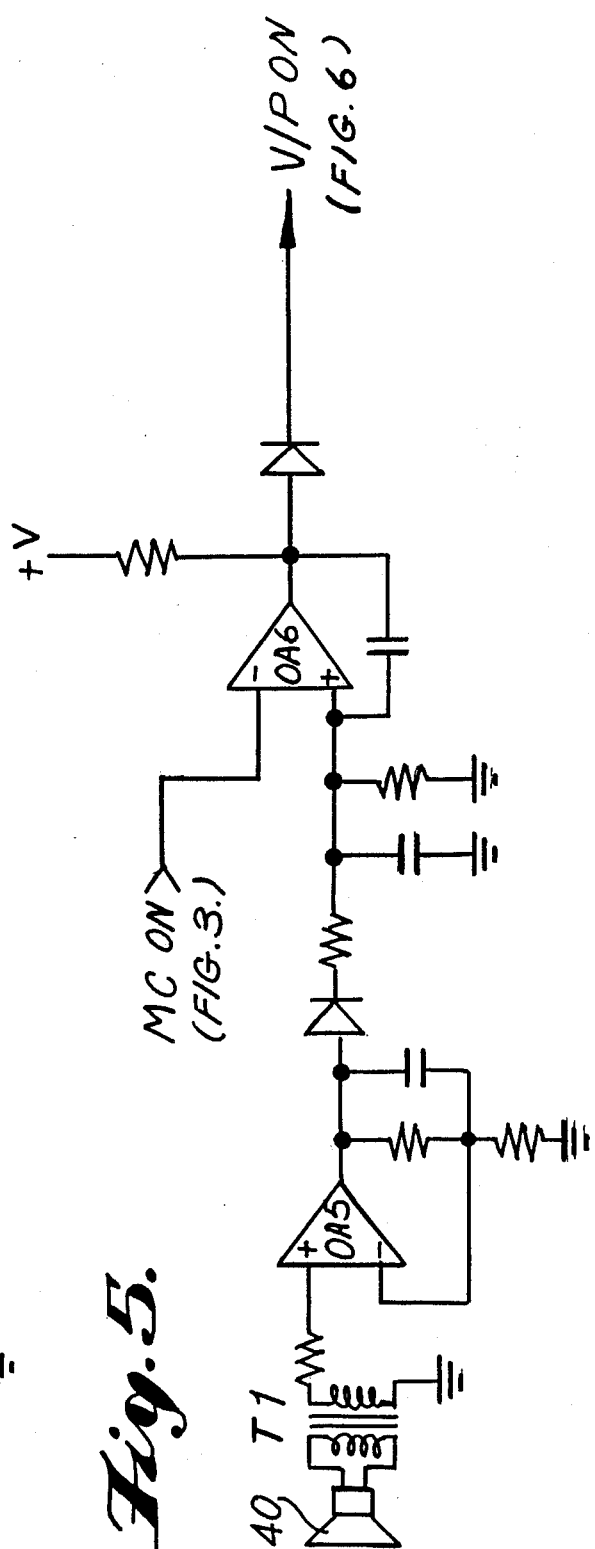

PROGRAMMABLE TIMER POWER SWITCH UNIT

BACKGROUND OF THE INVENTION
Field of the Invention

The present invention relates to a monitoring device for monitoring a system battery powering an external device, such as a two-way radio, when the motor is not running. During this time, the battery is discharged by the external device. A timer in the monitoring device allows the radio to run for a pre-set time. The device also includes a separate voltage detector which will override the timer and shut off the radio upon the detection of a low battery voltage as well as a vibration detector which detects vibrations from the engine to reset the timer whenever the motor is started.

The battery of the automobile powers CBs, AM/FM radios, two-way radios, radar devices and other electronic communication systems. A problem has developed from connecting numerous electronic equipment to the battery of the motor. This electronic equipment drains the car battery.

People who use communication systems in their cars or trucks need to leave the two-way radio, for example, on when the vehicle is unattended. With modern technology, this can include waiting for a page vehicle location detection by a control center, status reporting or in-coming data. The most common reason, however, is the inconvenience of manually turning the radio off each time one leaves the vehicle. Accordingly, people constantly forget at the end of the day to turn the radio off.

SUMMARY OF THE INVENTION

The unit described is designed to overcome the problems of the prior art. When the motor is not running, the battery is being discharged and this condition starts a timer which will eventually disconnect the radio or other connected equipment at the end of a pre-set time. If the battery is weak, a separate voltage detector will override the timer and shut the radio off. This condition will continue until the vehicle is started, thereby activating a vibration detector which will reset the system.

The programmable timer power switch, hereinafter referred to as PTPS is an electronic device that, when installed into a motor vehicle, will keep the battery from discharging to a point where it can no longer charge or turn over a motor from a cold start. When the situation arises, the user can choose to keep operating any equipment, e.g., CB, radio, or computer terminal, that is connected through the PTPS for a preselected period of time after the vehicle motor has been turned off.

This preselected period delays the time at which power is switched off to all equipment connected to the PTPS unit. The time interval is user programmable from one to nine hours, in one hour increments, by way of turning a single rotary switch. During this delay cycle, the PTPS is constantly monitoring for a low voltage battery level or any sudden current surges due to faulty equipment or poor charging which would causes the battery to be weak and non-operative.

Should any of the above conditions be detected, the PTPS unit will immediately deactivate the power switch from the battery , thus preventing the load through the PTPS from contributing to permanent damage to the battery itself. One light emitting diode (LED) will indicate any of these failures. In an emergency situation, the PTPS can be overridden manually through an external switch. When activated, this switch will bypass normal control circuitry and re-connect power to all the equipment connected through the PTPS unit.

One embodiment of the invention is illustrated in the figures and will be described in greater detail below and with reference to these figures.

BRIEF DESCRIPTION OF THE DRAWINGS

FIG. 1 is a block diagram of the programmable timer switch unit;

FIG. 2 is a schematic circuit diagram of a power up reset and low voltage detector;

FIG. 3 is a schematic circuit diagram of a motor charging detector made in accordance with the present invention;

FIG. 4 is a schematic circuit diagram of a rate of discharge detector made in accordance with the present invention;

FIG. 5 is a schematic circuit diagram of a vibration and pressure detector made in accordance with the present invention;

DESCRIPTION OF THE PREFERRED EMBODIMENTS

Figure 6:
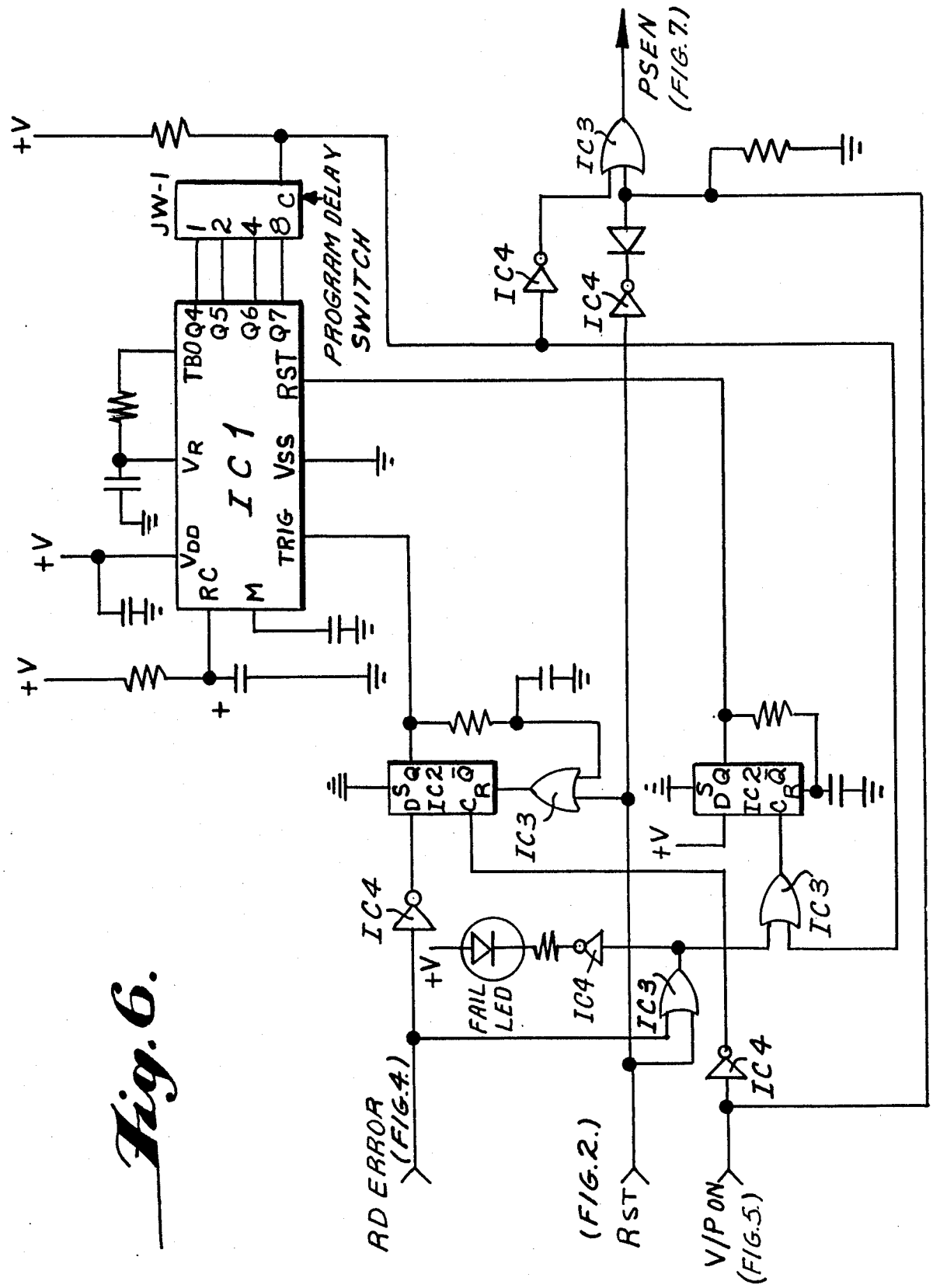
FIG. 6 is a schematic circuit diagram of the timer and control logic made in accordance with the present invention.

FIG. 1 is a block diagram of the PTPS unit generally indicated by numeral 10. PTPS unit 10 is connected between a vehicle battery 11 and electrical equipment 13. PTPS unit 10 consists of a number of detectors, switches and logic components.

There is a low voltage detector 12 for detecting the voltage of the motor battery 11. There is a vibration/pressure detector 14 which detects vibrations or sounds from the motor 15. There is a rate of discharge detector 16 which detects current from the vehicle battery 11. There is a motor charging detector 26 which sets a minimum voltage for operating vehicle battery 11. There is a timer/control logic unit 22 which receives signals from the detector units and indicates any errors or problems with a light emitting diode. There is a power switch 20 which controls the on-off power from the vehicle battery 11 to the electrical equipment 13. There is a programmable time delay switch 24 which can be manually set. There is a manual override switch 30 which is used to override the timer/control logic 22 of the system and turn "on" or "off" power switch 20.

Each section within PTPS unit 10 is inter-dependent and performs specific functions necessary for proper operation.

When vehicle motor 15 is ON, battery 11 charges to its full capacity. This charge raises the voltage level to approximately 14.5 volts D.C. During this time, vibration/pressure detector 14 monitors for vehicle vibrations, and verifies the vehicle is either in idle or moving mode. Both the low voltage 12 and the rate of discharge 16 detectors are in a constant testing state.

Unless the battery 11 is poorly charged, vehicle alternator (not shown) is not functional or equipment 13 is faulty as connected to the PTPS unit 10, these two detectors, 12 and 16, will not flag any fault conditions.

A fault condition is indicated by HIGH on the respective outputs of the detectors.

When the vehicle engine 15 is in idle or moving mode, the detectors indicate normal conditions and the manual override switch 30 is OFF. Now, PTPS unit 10 automatically activates the power switch 20 and power is sent to all equipment 13 connected to the vehicle battery 11 by way of PTPS unit 10. Under these conditions, power switch 20 will only be deactivated if a low voltage level or any excess current is detected.

When vehicle motor 15 is turned OFF, and the vehicle generator (not shown) has been deactivated, the battery voltage resumes a voltage level of 12 volts D.C. with the delay timer 24 programmed to some selected time period, such as 1–9 hours, timer/control logic 22 will continue to activate power switch 20 without any interruptions, but will start the delay timer 24 counting down the selected time interval. At this time, should no flags from either detector exist, (i.e., the low voltage 12 or rate of discharge 16) delay timer 24 will proceed counting to zero and deactivate power switch 20 at the end of the time period.

On the other hand, if a fault is detected during the countdown period, timer/control logic 22 will immediately reset the timer 24 as well as disable the power switch 20 and disconnect power to all equipment 13 which, is control by the PTPS unit 10.

The low voltage detector 12 will now be described with reference to FIG. 2. When the PTPS unit 10 is first installed into a motor vehicle, a power up RESET will be generated. When the power is initially applied, a fixed reference voltage on the non-inverting input of op-amp OA-1 will be established due to zener diode D1.

The voltage on the inverting input of op-amp OA-1 will not be established until capacitor C1 has been charged. While capacitor C1 is charging, the output of op-amp OA-1 will remain HIGH and cause timer/control logic 22 to disable power switch 20. In other words, the voltage on the inverting input is less than the voltage on the non-inverting input of op-amp OA-1 input. Once capacitor C1 has become charged, the voltage level on the non-inverting input will be high enough to cause the output of op-amp OA-1 to reverse to a normal LOW level.

With PTPS unit 10 operational, should vehicle battery 11 ever go below the reference voltage set by zener diode D1, a HIGH is generated at the output of op-amp OA-1 and a RESET signal is sent to timer/control logic 22 to disable power switch 20. The timer/control logic unit 22 will be further explained with reference to FIG. 6. This RESET signal is generated whether vehicle motor 15 is in idle, moving or OFF modes, and will remain HIGH until the voltage level has been corrected, such as replacing the battery or alternator. In emergency situations, manual override switch 30 can override control logic 22 allowing power switch 20 to continue to operate as long as manual override switch 30 is activated.

Referring to FIG. 3, motor charging detector 26 is used only to detect whether the alternator is charging the battery 11 to its full capacity by reflecting an elevated voltage of approximately 14.5 volts D.C. Motor charging detector unit 26 compares a fixed reference voltage with a ratio of the elevated voltage and verifies a battery voltage somewhere above 13.5 volts D.C. A HIGH on the output of op-amp OA-2 permits vibration/pressure detector unit 14 to pass its own D.C. sensed voltage through a comparator, such as op-amp OA-6 as shown in FIG. 5. This signal confirms the vehicle motor 15 is operating and is in idle or moving mode. The combination of these two detectors, (i.e., 14 and 26), prevents vehicle tampering and any external method of deception.

Referring to FIG. 4, while PTPS unit 10 is operating, rate of discharge detector 16 is constantly testing for excessive current or for any electrical failures that might occur, such as shorts or faulty equipment.

Op-amp OA-3 monitors the level of current consumed by the equipment 13, powered through the power switch 20 and converts the current to a voltage level. This level is sampled at a specific clock rate which is controlled by clock pulses from IC-4 and held steady by way of three MOS-FETS IC 5, when the clock is HIGH. This voltage level is then applied to the non-inverting input of op-amp OA-4 and compared to a threshold level that appears on the inverting input. The threshold level at op-amp OA-4 is a preset D.C. voltage which corresponds to the maximum allowable rate of discharge or current usage for the PTPS unit 10.

Whenever the sample voltage level is greater than the threshold level and the rate of current consumption has exceeded its normal safe level of usage, the output of op-amp OA-4 will go HIGH. This will reset timer/control logic 22 which in turn will disable power switch 20. However, because of the design of the PTPS circuit 10, large temporary bursts of excess current will be ignored to keep power switch 20 from being turned off or being interrupted due to any current surges invoked when any new equipment is activated.

Referring to FIG. 5, vibration/pressure detector 14 allows PTPS unit 10 to monitor and determine whether vehicle motor 15 is in idle, moving or OFF modes. Vibration and sound pressure is sensed through a transducer 40 coupled via a transformer T1 amplified by an op-amp OA-5. This output of an AC voltage is then filtered, conditioned, and applied to a non-inverting input of an op-amp OA-6 as a D.C. voltage. The inverting input of the op-amp OA-6 has a DC-reference voltage. As previously explained with reference to FIG. 3, this reference voltage is enabled only through motor charging detector 26 and corresponds to a preset level of vibration and sound pressure sensitivity. When vehicle motor 15 is in idle or moving modes, the non-inverting input of op-amp OA-6 will be higher than the inverting input and will produce a HIGH on the output. This HIGH signal will be sent to the timer/control logic 22 which will determine whether power switch shown 20 should be activated.

Should vehicle motor 15 be in the OFF mode, the output of op-amp OA-6 will be LOW, and this LOW signal will keep power switch 20 disabled.

With reference to FIG. 6, under the condition where vehicle motor 15 has just been turned OFF and no reset situation exists, a trigger pulse is generated by IC 2. This trigger pulse is ½ the normal pulse of IC 2 when vehicle motor 15 is in idle or moving modes. This pulse activates delay timer circuit IC 1 automatically and keeps power switch 20 enabled.

Referring more specifically to FIG. 6, timer/control logic 22 of PTPS unit 10 keeps track of all conditions being monitored and starts as well as resets delay timer IC 1 and controls power switch 20. The delay timer of IC 1 can be preprogrammed by the user through a rotary switch. For example, a time of one to nine hours, in one hour increments, could be set. This allows power switch 20 to conduct until the end of the pre-selected delay period.

A trigger pulse generates a signal which is ½ of IC 2 and will activate the delay timer of IC 1 if there is no RESET or if the current consumption by way of the rate of discharge- detector 16 is within normal limits, and if vehicle motor 15 has just been turned off by vibration/pressure detector 14.

Any time a failure condition is detected, by any of the detectors, a RESET or error signal will be sent to timer/control logic 22. Accordingly, the delay timer of IC 1 is reset and power switch 20 is disabled from conducting, except in the case of a manual override.

When a normal time delay period has completed its cycle, the delay timer of IC 1 will generate a HIGH on its combined outputs and cause control logic 22 to reset itself at ½ of IC 2. At the same time, power switch 20 will be disabled.

Figure 7:
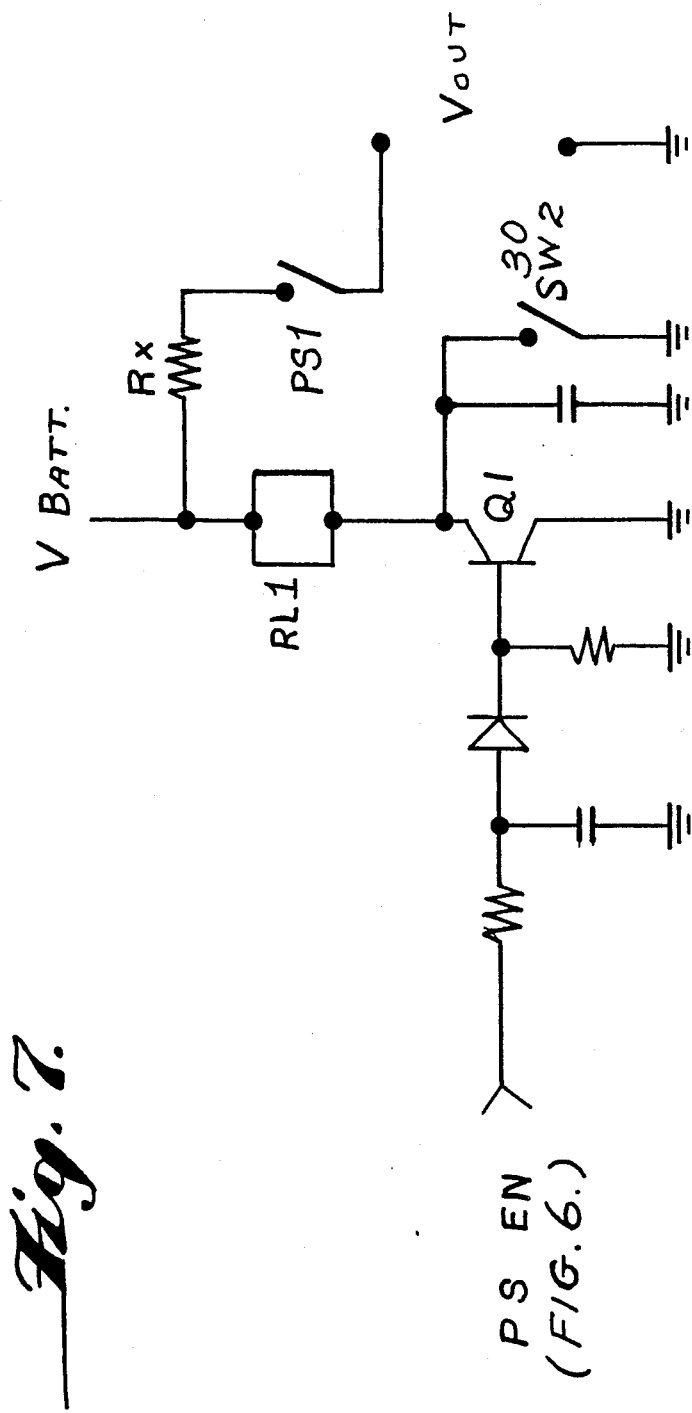
FIG. 7 is a schematic circuit diagram of a power switch unit made in with the present invention.

Referring now to FIG. 7, power switch 20 is essentially controlled through timer/control logic circuit 22. It consists of a basic transistor driver Q1 and a relay RL 1 that is rated for high current. When a HIGH is received from timer/control circuit 22, relay RL 1 will engage. The engaging of relay RL 1 permits current to flow to equipment 13 connected through PTPS unit 10. The option of manually override 30 is included by way of a switch SW 2 in the case of an emergency.

The following is a listing of suitable elements for the circuits of FIGS. 2-7:

| PTPS PARTS UNIT LIST | | |
| --- | --- | --- |
| LM 2903 | OA-4, OA-6 | Comparator |
| TLC 272 | OA-1, OA-2, OA-3, OA-5 | CMOS OP-AMP |
| UA2240C | IC 1 | Timer Chip |
| MC14013 | IC 2 | Dual D Flip-flop |
| MC14071 | IC 3 | Quad OR Gate |
| MM74C04 | IC 4 | Hex Inverter |
| MC14066 | IC 5 | Quad MOS-FETS |
| 2N2222 | Q1 | NPN Transistor |
| 1N5239 | D1 | Zener Diode |
| 1N5231 | D2 | Zener Diode |
| KDS-1 4–12 | SW-1 | BCD Rotary Switch |
| | T1 | Transformer |
| | LED | Light Emitting Diode |
| | Transducer | 32 Ohm Speaker |
| | SW-2 | SPST Toggle Switch |

All other diodes, resistors and capacitors are common components.

The foregoing is considered as illustrative only of the principles of the invention. Further, since numerous modifications and changes will readily occur to those skilled in the art, it is not desired to limit the invention to the exact construction and operation shown and described, and accordingly, all suitable modification and equivalents may be resulted to falling within the scope of the invention which is intended to be limited only by the scope of the claims.

I claim:

1. A programmable timer power switch unit for use with a motor and battery means, said unit comprising:
   power switch means receiving power from the battery means and switching the power to equipment powered by the battery means;
   charge-discharge detector connected to the battery means for detecting a potential charge of the battery means;
   vibration-pressure detector connected to said charge-discharge detector for detecting vibrations and sounds of the motor;
   timer-control logic receiving signals from said charge-discharge detector and said vibration-pressure detector for disabling said power switch means based on the received signals;
   programmable delay means connected to said timer-control logic for enabling said timer-control logic for a preselected time; and
   manual override switch connected to said power switch means for overriding the disabling signal received from said timer-control logic.

2. The programmable timer power switch unit of claim 1, wherein said charge-discharge detector comprises:
   rate of discharge detector for detecting electrical failures by monitoring current consumed by the equipment and comparing the current consumed with a threshold level, wherein the threshold level corresponds to a maximum current usage, said rate of discharge detector sending a rate of discharge error signal whenever the threshold level is exceeded; and
   motor charging detector for detecting a charge of the battery means by comparing the detected charge with a fixed reference and verifying the comparison with a HIGH to permit said vibration-pressure detector to indicate the mode.

3. The programmable timer power switch unit of claim 2, wherein said rate of discharge detector includes:
   op-amp monitoring means connected to the battery means and the equipment for monitoring the current consumed;
   converting means connected to said op-amp monitoring means for converting the monitored current to a voltage level;
   op-amp comparing means connected to said converting means for comparing the converted voltage level with the threshold level and sending the rate of discharge error signal whenever the threshold level is exceeded; and
   wherein said motor charging detector includes
   op-amp verifying means for verifying the charge of the battery means is at least 13.5 volts D.C.

4. The programmable timer power switch unit of claim 3, wherein said timer-control logic comprises:
   rate of discharge error input means connected to said op-amp comparing means for receiving the rate of discharge error signal and disabling said power switch means when the error signal indicates the threshold level is exceeded; and
   reset means connected to said rate of discharge error input means and said programmable delay switch for resetting said programmable delay switch whenever said power switch means is disabled based on the error signal.

5. The programmable timer power switch unit of claim 1, wherein said unit further comprises:
   low voltage detector for comparing an initial voltage of the battery means with a reference voltage during power-up or reset and indicating to said timer-control logic the battery voltage exceeds the reference voltage at which time said timer-control logic enables said power switch means.

6. The programmable timer power switch unit of claim 5, wherein said low voltage detector comprises:

low voltage op-amp means having a non-inverting input connected to a zener diode and a capacitor, wherein the reference voltage on the non-inverting input is established after the capacitor is charged such that before the capacitor is charged said low voltage op-amp means remains HIGH and indicates this status of power-up/reset to said timer-control logic which in turn maintains said power switch in the disabled mode.

7. The programmable timer power switch unit of claim 6, wherein said timer-control logic comprises:
power-up/reset input means connected to said low voltage op-amp means for resetting said programmable delay switch and for disabling said power switch means whenever the received signal from said low voltage op-amp means remains HIGH.

8. The programmable timer power switch unit of claim 1, wherein said vibration-pressure detector comprises:
transducer means for sensing vibrations and sounds of the motor;
transformer means connected to said transducer means for receiving and transforming the sensed vibrations and sounds to a voltage level; and
op-amp mode means connected to said transducer means for receiving said voltage level and comparing said voltage level to said received HIGH wherein the receipt of both said voltage level and said HIGH signifies the motor is either in idle or moving modes rather than an OFF mode.

9. The programmable timer power switch unit of claim 8, wherein said timer-control logic comprises:
vibration-pressure input means connected to said op-amp mode means for resetting said programmable delay switch and for disabling said power switch means whenever said op-amp mode means indicates the mode of the motor is OFF.

10. The programmable timer power switch unit of claim 1, wherein said programmable delay means comprises:
a rotary switch having at least a means for manually pre-selecting time wherein the pre-selected time includes at least one to nine hours and is selectable in one hour increments; and
reset means connected to said time-control logic so that said time-control logic can be reset by said programmable delay means.

11. A programmable timer power switch unit for use with a motor and battery means, said unit comprising:
power switch means receiving power from the battery means and switching the power to equipment powered by the battery means;
rate of discharge detector receiving current from the battery means and detecting current consumed by the equipment;
motor charging detector receiving charge from the battery means, said motor charging detector detecting a specific level of charge;
vibration-pressure detector receiving a signal from said motor charging detector indicating the battery means has the specific level of charge and detecting a mode of the motor, said mode determined from sounds and vibrations;
timer-control logic receiving signals from said rate of discharge detector, low voltage detector and vibration-pressure detector, said timer-control logic determining from the received signals whether a fault exists, if said fault exists, said timer-control logic disables said power switch and disconnects power to the equipment powered by the battery means;
programmable delay means connected to said timer-control logic and for enabling said timer-control logic for a pre-selected time; and
manual override switch means connected to said power switch means for overriding the disabling signal said power switch means receives from said timer-control logic.

12. The programmable timer power switch unit of claim 11, wherein said rate of discharge detector detects electrical failures by monitoring current consumed by the equipment and compares the current consumed with a threshold level, wherein the threshold level corresponds to a maximum current usage, and said rate of discharge detector sends a rate of discharge error signal whenever the threshold level is exceeded; and
said motor charging detector detects the charge of the battery means by, comparing the detected charge with a fixed reference voltage and verifies the comparison with a HIGH to permit said vibration-pressure detector to indicate the mode of the motor.

13. The programmable timer power switch unit of claim 12, wherein said rate of discharge detector includes op-amp monitoring means connected to the battery means and the equipment for monitoring the current consumed;
converting means connected to said op-amp monitoring means for converting the monitored current to a voltage level;
op-amp comparing means connected to said converting means for comparing the converted voltage level with the threshold level and sending the rate of discharge error signal whenever the threshold level is exceeded; and
wherein said motor charging detector includes
op-amp verifying means for verifying the charge of the battery means is at least 13.5 volts D.C.

14. The programmable timer power switch unit of claim 13, wherein said timer-control logic comprises:
rate of discharge error input means connected to said op-amp comparing means for receiving the rate of discharge error signal and disabling said power switch means when the error signal indicates the threshold level is exceeded; and
reset means connected to said rate of discharge error input means and said programmable delay switch for resetting said programmable delay switch whenever said power switch means is disabled based on the error signal.

15. The programmable timer power switch unit of claim 11, wherein said unit further comprises:
low voltage detector for comparing an initial voltage of the battery means with a reference voltage during power-up or reset and indicating to said timer-control logic the battery voltage exceeds the reference voltage at which time said timer-control logic enables said power switch means.

16. The programmable timer power switch unit of claim 15, wherein said low voltage detector comprises:
low voltage op-amp means having a non-inverting input connected to a zener diode and a capacitor, wherein the reference voltage on the non-inverting input is established after the capacitor is charged such that before the capacitor is charged said low voltage op-amp means remains HIGH and indicates this status of power-up/reset to said timer-control logic which in turn maintains said power switch in the disabled mode.

17. The programmable timer power switch unit of claim 16, wherein said timer-control logic comprises:
power-up/reset input means connected to said low voltage op-amp means for resetting said programmable delay switch and for disabling said power switch means whenever the received signal from said low voltage op-amp means remains HIGH.

18. The programmable timer power switch unit of claim 11, wherein said vibration-pressure detector comprises:
transducer means for sensing vibrations and sounds of the battery means;
transformer means connected to said transducer means for receiving and transforming the sensed vibrations and sounds to a voltage level; and
op-amp mode means connected to said transducer means for receiving said voltage level and comparing said voltage level to said received HIGH wherein the receipt of both said voltage level and said HIGH signifies the motor is either in idle or moving modes rather than OFF mode.

19. The programmable timer power switch unit of claim 18, wherein said timer-control logic comprises:
vibration-pressure input means connected to said op-amp mode means for resetting said programmable delay switch and for disabling said power switch means whenever said op-amp mode means indicates the mode of the motor is OFF.

20. The programmable timer power switch unit of claim 11, wherein said programmable delay means comprises:
a rotary switch having at least a means for manually pre-selecting time wherein the pre-selected time includes at least one to nine hours and is selectable in one hour increments; and
reset means connected to said time-control logic so that said time-control logic can be reset by said time-control logic.

* * * * *